(12) United States Patent
Garandet et al.

(10) Patent No.: US 9,373,504 B2
(45) Date of Patent: Jun. 21, 2016

(54) METHOD FOR FORMING AN EPITACTIC SILICON LAYER

(71) Applicant: COMMISSARIAT A L'ENERGIE ATOMIQUE ET AUX ENERGIES ALTERNATIVES, Paris (FR)

(72) Inventors: Jean-Paul Garandet, Le Bourget du Lac (FR); Etienne Pihan, La Motte Servolex (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/403,915

(22) PCT Filed: May 22, 2013

(86) PCT No.: PCT/IB2013/054231
§ 371 (c)(1),
(2) Date: Nov. 25, 2014

(87) PCT Pub. No.: WO2013/175411
PCT Pub. Date: Nov. 28, 2013

(65) Prior Publication Data
US 2015/0155168 A1    Jun. 4, 2015

(30) Foreign Application Priority Data
May 25, 2012 (FR) ...................................... 12 54875

(51) Int. Cl.
*H01L 21/02*    (2006.01)
*C30B 19/12*    (2006.01)
(Continued)

(52) U.S. Cl.
CPC .......... *H01L 21/02636* (2013.01); *C30B 19/12* (2013.01); *C30B 25/186* (2013.01);
(Continued)

(58) Field of Classification Search
CPC .............. H01L 31/368; H01L 31/3682; H01L 31/3685; H01L 21/02634; H01L 21/02636; H01L 21/02639; H01L 21/02642; H01L 21/02647; H01L 21/30604; C30B 25/186; C30B 25/20; C30B 29/06
See application file for complete search history.

(56) References Cited

U.S. PATENT DOCUMENTS

| 5,344,500 A | 9/1994 | Sasaki et al. |
| 5,403,771 A * | 4/1995 | Nishida ............... H01L 31/0745 117/923 |

(Continued)

FOREIGN PATENT DOCUMENTS

| CA | 1296468 C | 2/1992 |
| JP | H03-237093 A | 10/1991 |

(Continued)

OTHER PUBLICATIONS

Pihan, E. et al, "Polycrystalline Silicon Films on Ceramic Substrates by Aluminium-Induced Crystallisation Process," 3rd World Conference on Photovoltaic Energy Conversion, May 2003, pp. 1182-1185.
(Continued)

*Primary Examiner* — Ha Tran T Nguyen
*Assistant Examiner* — Aaron Dehne
(74) *Attorney, Agent, or Firm* — Oliff PLC

(57) ABSTRACT

The present invention relates to a method for manufacturing an epitactic silicon layer made up of crystallites with a size no lower than 20 μm, including: providing a layer of crystallized silicon the surface of which, being inhomogeneous in terms of the size of the crystallites, is made up of large crystallites with a size no lower than 20 μm, and small crystallites of a smaller size; forming, on the surface of the inhomogeneous silicon layer, a layer of at least one non-nucleating material for the silicon, the thickness of which is adjusted such to cover the entire outer surface of the small crystallites, while leaving all or part of the outer surface of the large crystallites accessible; and carrying out epitaxial growth of a silicon layer on the surface of the assembly obtained at the end of step, under conditions that are suitable for forming the expected epitactic layer.

26 Claims, 1 Drawing Sheet

(51) Int. Cl.
  C30B 25/18  (2006.01)
  C30B 25/20  (2006.01)
  C30B 29/06  (2006.01)
  H01L 21/306  (2006.01)
  H01L 21/3065  (2006.01)

(52) U.S. Cl.
  CPC ............... *C30B 25/20* (2013.01); *C30B 29/06* (2013.01); *H01L 21/02439* (2013.01); *H01L 21/02513* (2013.01); *H01L 21/02532* (2013.01); *H01L 21/02634* (2013.01); *H01L 21/02639* (2013.01); *H01L 21/3065* (2013.01); *H01L 21/30604* (2013.01)

(56) References Cited

U.S. PATENT DOCUMENTS

| | | | |
|---|---|---|---|
| 2005/0169330 | A1 | 8/2005 | Hongo et al. |
| 2009/0286086 | A1 | 11/2009 | Dierdorf et al. |
| 2010/0112792 | A1 | 5/2010 | de Souza et al. |

FOREIGN PATENT DOCUMENTS

| | | | |
|---|---|---|---|
| JP | 2003-092285 | A | 3/2003 |
| WO | 2004/012257 | A1 | 2/2004 |
| WO | 2004/093202 | A1 | 10/2004 |

OTHER PUBLICATIONS

Scholz, M. et al., "Silver-Induced Layer Exchange for the Low-Temperature Preparation of Intrinsic Polycrystalline Silicon Films," Applied Physics Letters., vol. 94, (2009), pp. 012108-1-012108-3.

Zhao, Shuyun et al., "P-17: Metal Induced Continuous Zonal Domain Polycrystalline Silicon and Thin Film Transistors," SID 07 Digest, (2007), pp. 233-236.

Schneider, Jens et al., "Depletion Regions in the Aluminum-Induced Layer Exchange Process Crystallizing Amorphous Si," Applied Physics Letters. vol. 87, (2005), pp. 031905-1-031905-3.

Xu, Ying et al., "10.21% Polycrystalline Silicon Thin Film Solar Cells on SiO2 Covered C-Si Substrates," 3rd World Conference on Photovoltaic Energy Conversion, (2003), pp. 1276-1278.

Funs, W. et al., "A Novel Route to a Polycrystalline Silicon Thin-Film Solar Cell," Solar Energy, vol. 77, (2004); pp. 961-968.

Kanno, Hiroshi et al., "Ge-Enhanced MILC Velocity in a-Ge/a-Si/SiO2 Layered Structure," Materials Science in Semiconductor Processing, vol. 8, (2005), pp. 83-88.

Kuo, Yue et al., "Polycrystalline Silicon Formation by Pulsed Rapid Thermal Annealing of Amorphous Silicon," Applied Physics Letters, vol. 69, No. 8, (1996), pp. 1092-1094.

Hartmann, J.M. et al., "Growth Kinetics of Si on Fullsheet, Patterned and Silicon-on-Insulator Substrates," Journal of Crystal Growth, vol. 257, (2003), pp. 19-30.

Müller, M. et al., "Silicon LPE on Substrates from metallurgical Silicon Feesdtock for Large Scale Production," 3rd World Conference on Photovoltaic Energy Conversion, (2003), pp. 1221-1224.

Reber, S. et al., "Crystalline Silicon Thin-Film Solar Cells-Recent Results of Fraunhofer ISE," Solar Energy, vol. 77, (2004), pp. 865-875.

Lebrun, Jean-Marie, "The Role of Silica Layer on Sintering Kinetics of Silicon Powder Compact," The Journal of the American Ceramic Society, (2012), pp. 1-10.

Aug. 12, 2013 International Search Report issued in International Patent Application No. PCT/IB2013/054231.

Aug. 12, 2013 International Written Opinion issued in International Patent Application No. PCT/IB2013/054231.

Peter, K. et al. "Thin Film Silicon Solar Cells on Upgraded Metallurgical Silicon Substrates Prepared by Liquid Phase Epitaxy," Solar Energy Materials & Solar Cells, vol. 74, (2002), pp. 219-223.

Olchowik, J.M. et al., "Influence of LPE Process Technological Conditions on Si ELO Layers Morpholoy," Journal of Non-Crystalline Solids, vol. 354, (2008), pp. 4287-4289.

\* cited by examiner

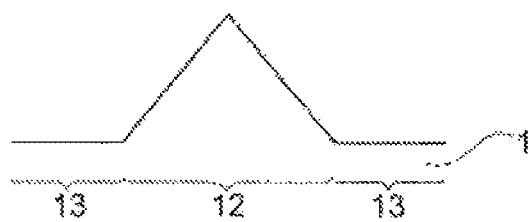
Fig. 1a
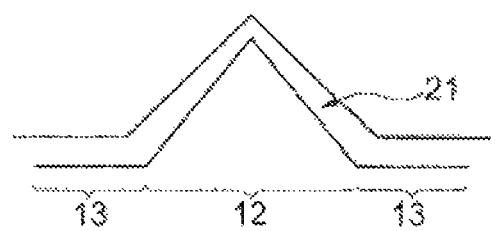
Fig. 1b
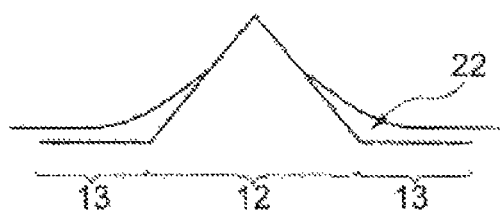
Fig. 1c
Fig. 1

METHOD FOR FORMING AN EPITACTIC SILICON LAYER

The present invention relates to a novel process for forming an epitaxial silicon layer, of good quality, formed of crystallites having a size of greater than or equal to 20 µm, from a crystalline silicon layer having a surface that is inhomogeneous in terms a crystallite size.

Silicon crystallized in the form of grains having a size of greater than 20 µm is indeed particularly advantageous for its semiconductor properties within the context of the production of photovoltaic cells.

Currently, photovoltaic cells are predominately manufactured from monocrystalline or polycrystalline silicon. The commonest chain of production for crystalline silicon employs the solidification of ingots from a bath of liquid silicon. These ingots are then cut into wafers, which may be converted into photovoltaic cells. Unfortunately, the sawing of the ingots leads to a loss of silicon material of the order of 50%. For obvious reasons, this loss of material linked to the sawing is prejudicial to the production yields.

In order to avoid the loss of material that occurs when these ingots are sawed into wafers, techniques have been developed with a view to directly producing silicon wafers.

However, the methods proposed for producing silicon in the form of wafers or ribbons having a typical thickness that varies between 100 and 500 µm (edge-defined film-fed growth, ribbon against drop and ribbon growth on substrate) are not completely satisfactory, especially with regard to the problems of cost and/or process control that they give rise to.

Another option for preventing the problem of loss of silicon material is to use liquid phase epitaxy techniques (LPE [1], [2]) or vapor phase epitaxy techniques (CVD or chemical vapor deposition [3]). These techniques make it possible to obtain layers of several tens of micrometers in thickness and of good crystalline quality, with a moderate cost and high solidification rates (typically from 0.1 to 5 µm/min).

Unfortunately, these techniques generally make it necessary to use substrates that are monocrystalline, and therefore expensive, in order to obtain layers of sufficient quality.

Yet for the purposes of reducing the costs, it is essential to avoid the use of monocrystalline silicon substrates, in favor of "low cost" polycrystalline silicon substrates.

In order to produce such polycrystalline silicon substrates, a technique based on the sintering of silicon powders has been proposed [4]. This technique makes it possible to produce a silicon wafer in two steps, the first consisting of hot pressing a bed of powders in a mold, and the second consisting of a thermal sintering. However, in order to enable effective sintering, the initial crystallites must be of submicron size, and the maturation during the process does not make it possible to obtain grains having a size of greater than 2 µm, even after several hours at 135° C. [5]. Such small sizes are unacceptable for applications that use substrates in the photovoltaic field.

To compensate for this problem, various grain recrystallization processes based on the use of a liquid phase have been proposed. For example, Reber et al. [3] propose a process that consists in heating the surface of a sintered wafer with infrared lamps or laser in order to melt the silicon at the surface over a thickness of the order of 10-20 µm, the liquid silicon then recrystallizing, in the form of millimeter-sized grains on cooling.

More recently, as an alternative to the process by Reber et al., an original and particularly advantageous technique based on the recrystallization, in liquid solvent, of sintered powder wafers has been developed. This technique consists more particularly in subjecting a sintered silicon wafer, the crystallites of which are of small size (typically of the order of micrometers), to a heat treatment at high temperature, but below the melting point of the silicon, in the presence of a metal solvent. This solvent ensures an effective transport of the silicon in the liquid phase, which makes it possible to increase the size of the large crystallites to the detriment of the smaller crystallites.

Thus, it is possible, via this process, to produce crystalline silicon, layers having large crystallites and having a thickness that may exceed about a hundred micrometers.

However, the large crystallites do not cover the whole of the surface of the crystalline silicon layer thus obtained, the latter comprising both large crystallites having a size of greater than 20 µm and small crystallites of smaller size.

Such a surface, used as a substrate for silicon epitaxy, unfortunately does not enable the growth of a silicon layer of satisfactory quality for applications in the photovoltaic field.

The present invention specifically aims to propose a novel process that makes it possible to form an epitaxial silicon layer, of good quality, from a crystalline silicon layer, only one surface fraction of which is formed of large crystallites, the remainder of the surface consisting of small-size crystallites.

Thus, the present invention relates to a process far forming an epitaxial silicon layer formed of crystallites having a size of greater than or equal to 20 µm, comprising at least the steps consisting in:

(1) providing a layer of crystalline silicon, the surface of which, inhomogeneous in terms of crystallite size, is formed:
of large crystallites having a size of greater than or equal to 20 µm, distributed over said surface in a non-continuous manner, the mean lateral spacing between two neighboring large crystallites not exceeding 200 µm; and
of small crystallites having a size smaller than that of the large crystallites, present in a surface fraction that does not exceed 60% of said surface;

(2) forming, at the surface of said inhomogeneous silicon layer, a layer of at least one material that is not nucleating for silicon and the thickness of which is adjusted to cover the whole of the outer surface of said small crystallites while leaving all or part of the outer surface of said large crystallites accessible; and (3) carrying out the epitaxial growth of a layer of silicon at the surface of the assembly obtained at the end of step (2), under conditions suitable for the formation of said expected epitaxial layer.

The inventors have thus discovered that it is possible to produce, via such a process, an epitaxial growth of good quality. The epitaxial silicon layer obtained at the end of the process of the invention is very predominantly formed of crystallites having a size greater than or equal to 20 µm.

Also, the process of the invention advantageously allows the implementation of any conventional epitaxy technique, whether it is as vapor phase epitaxy technique (CVD) or as liquid phase epitaxy technique (LPE).

Furthermore, the process of the invention lies perfectly within the context of producing photovoltaic devices. The material that is not nucleating for silicon, when it is a material of refractory ceramic type, may thus be advantageously incorporated into a photovoltaic device, constituting a structure that maximizes the reflectivity on the rear face of the epitaxial silicon layer obtained at the end of the process of the invention.

Other features, advantages and methods of application of the process according to the invention will emerge more clearly on reading the following description, given by way of illustration and without implied limitation, and in particular with reference to the appended FIG. 1.

More specifically, as expanded upon subsequently, FIG. 1 represents, schematically and in cross section, the structures obtained at the various stages of the implementation of a process in accordance with the invention.

It should be noted that, for reasons of clarity, the various elements in FIG. 1 are not drawn to scale, the actual dimensions of the various parts not being respected.

In the remainder of the text, the expressions "between . . . and . . . ", "ranging from . . . to . . . " and "varying from . . . to . . . " are equivalent and are understood to mean that the limits are included, unless otherwise mentioned.

Unless otherwise mentioned, the expression "having/comprising a" should be understood as "having/comprising at least one".

Step (1): Crystalline Silicon Layer

As mentioned above, the process of the invention uses a crystalline silicon layer having a surface that is inhomogeneous in terms of crystallite size.

More specifically, said surface has crystallites having a size of greater than or equal to 20 μm that do not completely cover the surface, the remainder of said surface being formed of small-size crystallites.

In the remainder of the text, the designation "large crystallites" will denote the crystallites having a size of greater than or equal to 20 μm and, conversely, the designation "small crystallites" will, denote small-size crystallites, that is to say having a size strictly less than 20 μm.

The large crystallites may more particularly have a size ranging from 30 to 150 μm, in particular from 60 to 100 μm.

The size of the crystallites may be defined within the meaning of the invention by the square root of the surface area (with, for example, a unit of surface area in $\mu m^2$) said crystallite.

The surface area of a crystallite may for example be deduced from an analysis of an image obtained by optical microscopy or by scanning electron microscopy (SEM).

As mentioned above, the large crystallites are distributed over the surf in a non-continuous manner. In other words, generally, too large crystallites are not contiguous, and more particularly spaced out, within the context of the present invention, by zones occupied by small crystallites. In particular, the mean lateral spacing between two neighboring large crystallites does not exceed 200 μm. In particular, it may range from 1 to 200 μm, and more particularly from 20 to 100 μm.

The small-size crystallites, referred to as "small crystallites", may more particularly have a size of less than 10 μm, in particular ranging from 0.2 to 5 μm.

They represent a surface fraction of less than or equal to 60% of the surface of said silicon layer.

In particular, the surface fraction of said small crystallites may range from 1% 2.0 to 60%, and more particularly from 10% to 40%, of said surface.

As for the size of the crystallites, the surface fraction may be obtained by analysis of an image obtained by SEM or by optical microscopy, by calculating the surface area occupied by the crystallites.

Said crystalline silicon layer used in step (1) may have a thickness ranging from 100 to 1000 μm, in particular from 300 to 600 μm.

According to one particular variant of the invention, said large crystallites of the surface are of pyramidal shape.

Of course, the expression "pyramidal shape" is understood to mean an approximately pyramidal shape.

Such a variant is more particularly illustrated in future 1a, represented in which, in cross section, is a crystalline silicon layer (1) having at the surface, a large crystallite (12) of pyramidal shape and, on either side of said large crystallite, surface zones occupied by small crystallites (13).

Preparation of the Crystalline Silicon Layer

The crystalline silicon layer from step (1) may be prepared prior to its use in the process of the invention.

The development which follows describes, by way of example, a process for preparing such a crystalline silicon layer.

This may, for example, be obtained from an inexpensive silicon substrate, like the sintered silicon, via a controlled process of maturation of silicon grains brought into contact with a composition formed completely or partly from a molten metallic solvent and according to a specific thermal process.

More particularly, this crystalline silicon layer may be obtained from a layer of silicon to be (re)crystallized, the mean grain size of which is less than 5 μm, by:

bringing said layer to be (re)crystallized, in particular sintered layer, into contact with a liquid composition formed completely or partly from at least one metallic solvent; and exposing the assembly to a heat treatment suitable for the (re)crystallization of said layer of silicon to the expected crystallite size, said heat treatment comprising the heating of the assembly formed by the silicon layer in contact with said liquid composition at a temperature below 1410° C., and at least equal to the eutectic temperature in the solvent-silicon phase diagram.

The liquid composition used may be formed from one or more metallic solvents and, where appropriate, from one or more other additional materials.

Said metallic solvent(s) may for example be selected from indium, tin, copper, gallium and alloys thereof.

As additional material, mention may especially be made of solid silicon, in particular present in a content ranging from 0 to 4% by weight, preferably from 0 to 2% by weight relative to the total weight of the liquid composition.

The liquid composition may additionally incorporate one or more p-type dopants, such as for example aluminum (Al), gallium (Ga), indium (In) and boron (B), or n-type dopants such as for example antimony (Sb), arsenic (As) and phosphorus (P), and mixtures thereof; especially in a proportion ranging from 0.05 to 5 atomic ppm, preferably 0.1 to 1 atomic ppm.

Said liquid composition may be formed prior to being brought into contact with said layer of silicon to be (re)crystallized.

Alternatively, it may be formed directly in contact with said layer of silicon to be (re)crystallized via the provision, at the surface of said silicon layer, of a solid-phase composition comprising at least one metallic solvent intended to form said liquid composition, and the heating of the assembly at a temperature at least equal to the eutectic temperature in the solvent-silicon phase diagram and below 1410° C.

For example, said liquid composition may be formed at the surface of said layer of silicon to be (re)crystallized via the deposition, at the surface of said silicon layer, of solid indium followed by heating of the assembly at a temperature of 1000° C.

The heat treatment requires a temperature suitable for the evaporation of the liquid metallic solvent and therefore for obtaining a silicon supersaturation of said liquid composition.

As specified above, the assembly formed by the layer of silicon to be (re)crystallized and the composition based on metallic solvent(s) is subjected to a heat treatment suitable for the maturation of the grains to be (re)crystallized.

Advantageously, the heat treatment step may be carried out while maintaining a constant temperature that enables the vaporization of all of said liquid metallic solvent, in particular that varies from 800° C. to 1350° C. especially from 1000° C. to 1200° C.

By way of examples, the formation of said layer of (re)crystallized silicon may be carried out using a liquid composition of tin and silicon, the temperature of which is maintained between 1050° C. and 1150° C., or else using a liquid composition of indium, the temperature of which is maintained between 950° C. and 1050° C.

This heat treatment step may be carried out by any heating technique known to a person skilled in the art and conventionally used for producing photovoltaic cells, for example in a tunnel furnace or else a resistance heating furnace.

Preferably, the step of bringing into contact with the liquid composition and the heat treatment step are carried out simultaneously.

Such a process results in a silicon layer that corresponds to the specific features described above, the large crystallites having in particular a pyramidal morphology.

Step (2): Layer of Material that is not Nucleating for Silicon

According to a second step of the process of the invention, a layer of at least one material that is not nucleating for silicon, the thickness of which is adjusted to cover the whole of the outer surface of said small crystallites and to leave all or some of the outer surface of said large crystallites accessible, is formed at the surface of said crystalline silicon layer described above.

An "accessible" surface is understood to denote the fact that the outer surface of said large crystallites is, at least partly, not covered by said layer of non-nucleating material, that is to say remains in direct contact with the surrounding atmosphere.

According to one particular embodiment, such a layer of non-nucleating material having the desired adjusted thickness may be produced via the steps consisting of:

(i) forming a layer of at least one material that is not nucleating for silicon on said surface from step (1), said layer covering at least the whole of the outer surface of said small crystallites; and (ii) exposing said coated surface from step (i) to a surface treatment suitable for the removal of the layer of non-nucleating material over all or part of the outer surface of said large crystallites.

These steps are expanded upon in the remainder of the text, in particular with reference to the appended FIGS. 1b and 1c.

Step (i): Formation of a Layer of Material that is not Nucleating for Silicon

The expression "material that is not nucleating for silicon" is understood to denote a material capable of limiting the nucleation of silicon. Such materials are well known to a person skilled in the art. They are generally characterized by a wetting angle with solid silicon of greater than 90°.

According to ore particular embodiment, the material that is not nucleating for silicon is a ceramic material.

It may be more particularly selected from the compounds of general formula $SiO_xN_yC_z$, with x being greater than or equal to 0.1, preferably greater than or equal to 03, y and z each being greater than or equal to 0.

According to one particular embodiment, the layer of said non-nucleating material from step (i) may be formed by:

(a) bringing said surface to be treated into contact with one or more precursors of said material that is not nucleating for silicon; and (b) heat treatment of the assembly formed by said surface in contact with said precursor(s), suitable for the formation of said layer of non-nucleating material; the steps (a) and (b) being consecutive or simultaneous.

The expression "precursor of the non-nucleating material" is understood to mean a compound capable of resulting, by heat treatment, in said non-nucleating material.

In particular, in the case of the formation of silicon oxides, nitrides or carbides as non-nucleating materials, said precursor(s) may be selected from organosilicon polymers.

The layer of non-nucleating material may thus be obtained by thermal decomposition of said organosilicon polymers.

According to one particular embodiment, the organosilicon polymers may be selected from polysilazane(s) and/or polysiloxane(s).

Accordion to a first embodiment variant of the invention, the material that is not nucleating for silicon derives from the thermal decomposition of polysilazane(s).

Polysilazanes are organosilicon polymers, the main backbone of which consists of a sequence of silicon and nitrogen atoms.

The polysilazanes suitable for the invention may be represented by the following formula $-(SiR'R''-NR''')-(SiR^*R^{}-NR^{*})_p-$, in which R', R'', R''', R*, R and R* represent, independently of one another, a hydrogen atom or a substituted or unsubstituted alkyl, aryl, vinyl or (trialkoxysilyl)alkyl radical, n and p having values such that the polysilazane has an average molecular weight ranging from 150 to 150 000 g/mol.

Such polysilazanes are in particular described in document US 2009/0286086.

By way of example, mention may be made of the perhydropolysilazanes sold by the company Clariant.

According to another embodiment variant of the invention, the material that is not nucleating for silicon derives from the thermal decomposition of polysiloxane(s). Polysiloxanes are organosilicon polymers, the main backbone of which consists of a sequence of silicon and oxygen atoms.

The polysiloxanes suitable for the invention may be represented by the following formula $(SiR_1R_2-O)_k-(SiR_3R_4-O)$, in which $R_1$, $R_2$, $R_3$ and $R_4$ represent, independently of one another, H, $CH_3$, $C_2H_5$, $C_6H_5$, $CH_2=CH-$, etc., k and m are between 1 and 1000.

Such polysiloxanes are for example described in document CA 1296468.

By way of example, mention may be made of the polyalkylsiloxanes sold under the reference FOx® (Flowable Oxides) by the company Dow Corning.

Preferably, the organosilicon polymers are selected from polyalkylsiloxanes and perhydropolysilazanes.

Said precursor(s) of said non-nucleating material, in particular the organosilicon polymers described above, may be used in liquid solution.

The solution of precursors of said non-nucleating material may comprise, besides said precursor(s), a solvent, for example an aprotic anhydrous solvent, and where appropriate, a polymerization initiator, for example of organic peroxide type.

As aprotic anhydrous solvent, mention may especially be made of toluene, dimethylformamide, dimethyl sulfoxide and dibutyl ether.

As polymerization initiator, mention may especially be made of dicumyl peroxide, diperoxyester, peroxycarbonate or zirconium acetyl acetate.

Preferably, the solution of polysilazane(s) and/or polysiloxane(s) used according to the invention comprises from 10% to 90% by weight of polysilazane(s) and/or polysiloxane(s) with respect to the total weight of said solution, in particular from 20% to 80% by weight, and more particularly from 40% to 60% by weight.

Bringing the surface into contact, in step (a), with the solution comprising said precursor(s) of the non-nucleating material may be carried out by any conventional technique known to a person skilled in the art. For example, it may be deposited by dip coating, spin coating, spray coating or brush application.

Preferably, it is carried out by spin coating.

The heat treatment of step (b) may more particularly comprise the heating of the assembly formed by said surface in contact with said precursor(s), at a temperature suitable for the formation of said layer of non-nucleating material, and more particularly, within the context of the use of a solution of organosilicon polymers as precursors, at a temperature suitable for the condensation-crosslinking of said polymers.

It is up to the knowledge of a person skilled in the art to adapt the operating conditions in order to form the layer of non-nucleating material. In particular, it will be necessary to be sure to obtain a layer of non-nucleating material of high purity, in view of its use in photovoltaic devices.

Thus, the heat treatment step (b) may be carried out at a temperature ranging from 300° C. to 700° C., in particular from 400° C. to 600° C. The heating is preferably performed under a controlled atmosphere, in particular under a nitrogen atmosphere or in air.

The heat treatment may be carried out for a duration of at least 30 minutes, in particular of at least 1 hour.

Advantageously, an additional heat treatment could be carried out at the end of step b), at a temperature of at least 1000° C., for at least one hour, under an oxidizing atmosphere, in order to surface oxidize the layer obtained.

According to one particular embodiment, the layer of non-nucleating material formed at the end of step (i) may cover the whole of the surface of said silicon layer, that is to say both the outer surface of said large crystallites and that of said small crystallites.

The layer of non-nucleating material formed at the end of step (i) may have a thickness ranging from 0.05 to 5 µm, in particular from 0.2 to 2 µm.

The thickness of the outer layer may be determined conventionally by scanning electron microscopy (SEM).

The layer of non-nucleating material formed at the end of step (i) is preferably of variable thickness, with a smaller thickness at the surface of said large crystallites with respect to the thickness at the surface of said small crystallites.

Such a variation of thickness of the layer is for example obtained, in the case where the large surface crystallites are of pyramidal shape. As illustrated in FIG. 1b, the layer of non-nucleating material (21), obtained at the end of step (i) described above, has a thickness at the surface of said large crystallites (12) that is generally smaller with respect to that at the surface of said small crystallites (13).

Step (ii): Surface Treatment

The surface coated with the layer of non-nucleating material obtained at the end of step (i) described above is subjected to a surface treatment suitable for removing the layer of non-nucleating material over all or part of the outer surface of said large crystallites.

This surface treatment step may more particularly be carried out by etching. A person skilled in the art is capable of using known etching techniques and adapting the operating conditions for their implementation in order to obtain the desired layer of non-nucleating material, leaving the outer surface of said large crystallites at least partially free.

This etching may be wet etching. For example, in the case where the non-nucleating material is formed of silicon oxide, the etching may be carried out using, a solution of hydrofluoric acid.

According to another embodiment variant, this etching may be plasma etching, also referred to as dry etching, for example argon plasma etching.

The surface treatment of step (ii) may or may not be a localized treatment, depending in particular on the thickness of the layer of material formed in step (O.

Thus, in the case where the deposit of no nucleating material obtained in step (i) is of smaller thickness at the surface of said large crystallites, as illustrated in FIG. 1b, the surface treatment of step (ii) may be carried out uniformly over the whole of the surface of said layer, so as to at least partially free the outer surface of said large crystallites while retaining a deposit of non-nucleating material at the surface of said small crystallites.

The surface treatment may alternatively be carried out by directional plasma etching, in particular argon plasma etching.

Directional plasma etching is particularly advantageous, on account of the anisotropy of the etching rate, for locally removing the layer of non-nucleating material and thus freeing the outer surface of said large crystallites.

For example, in the case where the large crystallites are of pyramidal shape, directional plasma etching is particularly effective for removing the layer of non-nucleating material at oblique incidence and thus uncovering the sides of the pyramidal crystallites while leaving said non-nucleating material remaining at the surface of the small crystallites.

At the end of this surface treatment, as illustrated in FIG. 1e, the layer of non-nucleating material (22) covers the Whole of the outer surface of said small crystallites (13) and leaves the outer surface of said large crystallites (12) at least partially accessible.

Step (3): Epitaxial Growth

According to a third step of the process of the invention, the surface of the assembly obtained at the end of step (2) of the process of the invention serves as a substrate for the epitaxial growth of a silicon layer.

As mentioned above, this epitaxial growth may be carried out by any epitaxy technique known to a person skilled in the art.

Thus, according to a first embodiment variant, step (3) may be carried out by liquid phase epitaxy (LPE). The principle of LPE is to bring a liquid bath comprising silicon and a solvent to a temperature that is high, but below the melting point of the silicon. Once the substrate to be coated has been brought into contact with the bath, the silicon precipitates and crystallizes on the substrate, by gradual lowering of temperature of the bath (from 0.1° C./min to 1° C./min).

For example, the epitaxy in step (3) may be carried out using a liquid bath comprising silicon and tin.

According to a second embodiment variant, step (3) may be carried out by vapor phase epitaxy (CVD). CVD technology is itself based on the decomposition of a gaseous precursor, for example slime or a chlorosilane, in the vicinity of the substrate to be coated.

For example, the epitaxy in step (3) may be carried out by using trichlorosilane as precursor.

It is up to a person skilled in the art to adjust the operating conditions, especially in terms of temperature and duration of the growth process, in order to obtain the desired epitaxial silicon layer.

At the end of step (3) of the process of the invention, the epitaxial layer is formed very predominantly from crystallites having a size of greater than or equal to 20 µm.

in particular, the epitaxial silicon layer obtained at the end of the process of the invention is formed of at least 95% of crystallites having a size greater than or equal to 20 µm, relative to the total number of crystallites present in the crystallite layer.

Preferably, the proportion of crystallites having a size of greater than or equal to 20 µm present in the epitaxial silicon layer is at least 99%, and very advantageously 100%.

Preferably, the crystallites of the epitaxial silicon layer obtained at the end of step (3) have a size of greater than or equal to 50 µm, and more particularly greater than or equal to 100 µm.

The invention will now be described, by means of the following examples given of course by way of illustration and with no implied limitation of the invention.

EXAMPLES

Example 1 i. Crystalline Silicon Layer

The starting substrate is obtained from a sintered wafer (mean grain size of 1 µm) via a grain maturation treatment in a liquid indium solvent, at 1000° C., for 4 hours.

At the end of this treatment, the substrate has a pyramidal morphology, the pyramids of which have a man side, measured by scanning electron microscopy (SEM), of 60 µm, and comprises a surface fraction covered by small grains unsuitable for the epitaxy process, measured by SEM, of 20%.

ii. Layer of Material that is not Nucleating for Silicon

Formation of a Layer of Material that is not Nucleating for Silicon

A layer of FOx-25® sold by DOW Corning (octamethyltrisiloxane and hexamethylsiloxane) is deposited by spin coating with a rotational speed of 1000 rpm.

After a heat treatment of 1 hour at 400° C. under a nitrogen atmosphere, a layer of silica is formed, the thickness of which, measured by SEM, is on average 0.4 µm on the pyramids, and around 2 µm on the zones covered by small grains.

Surface Treatment

The coated substrate is subjected to etching in a 49% concentrated hydrofluoric acid solution, at ambient temperature, for 10 seconds, which makes it possible to reveal the sides of the pyramids while leaving silica remaining on the zones covered by small grains.

iii. Epitaxial Growth

After etching, as 20 µm layer of silicon is deposited by CVD (chemical vapor deposition) from a trichlorosilane precursor at 1140° C. The duration of the growth process is around 5 minutes. At the end of the deposition process, the size the grains at the surface of the wafer, measured by SEM, is on average 50 µm.

Example 2 i. Crystalline Silicon Layer

The starting substrate is obtained from a sintered wafer (mean grain size of 1 µm) via a grain maturation treatment in a liquid tin solvent, at 1100° C., for 5 hours.

At the end of this treatment, the substrate has a pyramidal morphology, the pyramids of which have a mean side, measured by SEM, of 80 µm, and comprises a surface fraction covered by small grains unsuitable for the epitaxy process, measured by SEM, of 35%.

ii. Layer of Material that is not Nucleating for Silicon

Formation of a layer of material that is not nucleating silicon

A layer of PHPS (perhydropolysilazane), sold by the company Clariant, is deposited by spin coating with a rotational speed of 2000 rpm. After a heat treatment of 1 hour at 600° C. under a nitrogen atmosphere, a layer of silicon oxynitride is formed, the thickness of which, measured by SEM, is on average 100 nm on the pyramids, and around 400 nm on the zones covered by small grains.

Surface Treatment

The coated substrate is subjected to an argon plasma treatment for 1 hour, which makes it possible to reveal the sides of the pyramids while leaving silicon oxynitride remaining on the zones covered by small grains.

iii. Epitaxial Growth

After chemical attack, a 40 pill layer of silicon is deposited by LPE phase epitaxy) from a tin solution at 1100° C. The duration, of the growth process is around 4 hours. At the end of the deposition process, the size of the grains at the surface of the wafer, measured by SEM, is 100 µm.

REFERENCES

[1] Peter et al., Thin film silicon solar cells on upgraded metallurgical silicon substrates prepared by LPE; Solar Energy Materials and Solar Cells 74 (2002) 219;
[2] Olchowik et al., Influence of LPE process technological conditions on Si ELO layers morphology, J. Non Crystalline Solids 354 (2008) 4287;
[3] Reber of al., Crystalline silicon thin film solar cells— recent results at Fraunhoffer I S E, Solar Energy. 77 (2004) 865-875;
[4] Patent application WO 2004/093202;
[5] Lebrun et al., J. Am. Ceramic. Soc. 1-9 (2012), DOI: 10.1111/j.1551-2916.2011.05052.x.

The invention claimed is:

1. A process for forming an epitaxial silicon layer formed of crystallites having a size of greater than or equal to 20 µm, comprising at least the steps consisting in:
 (1) providing a layer of crystalline silicon, the surface of which, inhomogeneous in terms of crystallite size, is formed:
  of large crystallites having a size of greater than or equal to 20 µm, distributed over said surface in a non-continuous manner, the mean lateral spacing between two neighboring large crystallites not exceeding 200 μm; and
of small crystallites having a size smaller than that of the large crystallites, present in a surface fraction that does not exceed 60% of said surface;
(2) forming, at the surface of said layer of crystalline silicon, a layer of at least one material that is not nucleating for silicon and the thickness of which is adjusted to cover the whole of the outer surface of said small crystallites while leaving all or part of the outer surface of said large crystallites accessible; and
(3) carrying out epitaxial growth of a layer of silicon at the surface of the assembly obtained at the end of step (2), under conditions suitable for the formation of said epitaxial layer.

2. The process as claimed in claim 1, wherein said large crystallites of said surface from step (1) are of pyramidal shape.

3. The process as claimed in claim 1, wherein the mean lateral spacing between two neighboring large crystallites of said surface from step (1) ranges from 1 to 200 μm.

4. The process as claimed in claim 1, wherein the mean lateral spacing between two neighboring large crystallites of said surface from step (1) ranges from 20 to 100 μm.

5. The process as claimed in claim 1, wherein the surface fraction of said small crystallites from step (1) ranges from 1% to 60%, of said surface.

6. The process as claimed in claim 1, wherein the surface fraction of said small crystallites from step (1) ranges from 10% to 40% of said surface.

7. The process as claimed in claim 1, wherein step (2) comprises at least the steps consisting of:
(i) forming a layer of at least one material that is not nucleating for silicon on said surface from step (1), said layer covering at least the whole of the outer surface of said small crystallites; and
(ii) exposing said coated surface from step (i) to a surface treatment suitable for the removal of the layer of non-nucleating material over all or part of the outer surface of said large crystallites.

8. The process as claimed in claim 1, wherein said material that is not nucleating for silicon is a ceramic material.

9. The process as claimed in claim 1, wherein said material that is not nucleating for silicon is selected from the compounds of general formula $SiO_xN_yC_z$, with x being greater than or equal to 0.1, y and z each being greater than or equal to 0.

10. The process as claimed in claim 7, wherein step (i) comprises (a) bringing said surface to be treated into contact with one or more precursors of said non-nucleating material, and (b) the heat treatment of the assembly formed by said surface in contact with said precursor(s), suitable for the formation of said layer of non-nucleating material, the steps (a) and (b) being consecutive or simultaneous.

11. The process as claimed in claim 10, wherein said precursors of non-nucleating material are selected from organosilicon polymers.

12. The process as claimed in claim 11, wherein said organosilicon polymer(s) is/are selected from polysilazane(s) and/or polysiloxane(s).

13. The process as claimed in claim 11, wherein said organosilicon polymer(s) is/are selected from polyalkylsiloxanes and perhydropolysilazanes.

14. The process as claimed in claim 10, wherein bringing said surface into contact with said precursor(s) of the non-nucleating material (a) is carried out by dip coating, spin coating, spray coating or brush application of a liquid solution comprising said precursor(s).

15. The process as claimed in claim 10, wherein said heat treatment (b) comprises heating at a temperature ranging from 300° C. to 700° C.

16. The process as claimed in claim 10, wherein said heat treatment (b) is performed under a nitrogen atmosphere or in air.

17. The process as claimed in claim 10, comprising, in addition, at the end of step b), an additional heat treatment, under an oxidizing atmosphere, for at least one hour and at a temperature of at least 1000° C.

18. The process as claimed in claim 7, wherein said surface treatment from step (ii) is carried out by etching.

19. The process as claimed in claim 18, wherein said surface treatment from step (ii) is carried out, in the case where said non-nucleating material is formed of silicon oxide, by etching using a solution of hydrofluoric acid.

20. The process as claimed in claim 7, wherein said treatment from step (ii) is carried out by directional plasma etching.

21. The process as claimed in claim 20, wherein said treatment from step (ii) is carried out by argon plasma etching.

22. The process as claimed in claim 1, wherein step (3) is carried out by liquid phase epitaxy.

23. The process as claimed in claim 22, wherein step (3) is carried out by using a liquid bath comprising silicon and a solvent.

24. The process as claimed in claim 1, wherein step (3) is carried out by vapor phase epitaxy.

25. The process as claimed in claim 24, wherein step (3) is carried out by using trichlorosilane as precursor.

26. The process as claimed in claim 1, wherein said epitaxial silicon layer obtained at the end of step (3) has a crystallite size of greater than or equal to 50 μm.

* * * * *